United States Patent [19]
Su

[11] Patent Number: 5,790,412
[45] Date of Patent: Aug. 4, 1998

[54] RECURSIVE FREQUENCY AGING ESTIMATION AND PREDICTION DEVICES, METHODS AND COMPUTER PROGRAMS FOR CRYSTAL OSCILLATORS

[75] Inventor: Wei Su, Staten Island, N.Y.

[73] Assignee: The United States of America as represented by the Secretary of the Army, Washington, D.C.

[21] Appl. No.: 869,341

[22] Filed: Jun. 5, 1997

[51] Int. Cl.$^6$ .................................................. G01R 23/00
[52] U.S. Cl. .................................. 364/484; 364/572
[58] Field of Search ............................. 364/484, 517, 364/554, 572; 331/158, 160, 176; 455/67.1, 115, 226.1

[56] References Cited

U.S. PATENT DOCUMENTS

| | | | |
|---|---|---|---|
| 4,949,055 | 8/1990 | Leitl | 331/158 |
| 5,512,863 | 4/1996 | Vig et al. | 331/158 |
| 5,659,884 | 8/1997 | Daughtry, Jr. et al. | 455/67.1 |

Primary Examiner—James P. Trammell
Assistant Examiner—Kamini S. Shah
Attorney, Agent, or Firm—Michael Zelenka; George B. Tereschuk

[57] ABSTRACT

A recursive crystal oscillator aging estimation and prediction device is provided comprising a crystal oscillator connected to a calculation means having several software programs, including frequency aging calculation algorithms based on new mathematical models for estimating and predicting frequency aging, respectively. The calculation means, being an oscillator model, and having a means to use a plurality of shifted logarithmic functions which describe the effects of a given frequency output of said crystal oscillator is connected to a frequency correction circuit. When a frequency reference is available, the calculation means performs a plurality of parameter. When a frequency reference is not available, an output of oscillator is compared to an output of the oscillator model of the calculation means, resulting in a frequency error, which is then fed to the crystal oscillator to correct the frequency with the calculation means acting as a temporary frequency reference to correct the frequency error within said frequency output. The present invention also discloses recursive crystal oscillator aging estimation and prediction methods and a computer-readable medium whose contents cause a computer system to recursively estimate and predict the aging of a crystal oscillator, as an article of manufacture.

27 Claims, 4 Drawing Sheets

RECURSIVE FREQUENCY AGING ESTIMATION AND PREDICTION DEVICES, METHODS AND COMPUTER PROGRAMS FOR CRYSTAL OSCILLATORS

GOVERNMENT INTEREST

The invention described herein may be manufactured, used and licensed by or for the Government of the United States of America without the payment to me of any royalties thereon.

BACKGROUND OF THE INVENTION

1. Field of the Invention

The present invention relates in general to the field of quartz crystal oscillators and more particularly to devices, methods and articles of manufacture to estimate and predict frequency aging in order to attain precision quartz crystal oscillators.

2. Description of the Prior Art

Due to the continuing interest in low cost, high performance time-keeping devices, precision quartz crystal oscillators play an important role in today's commercial and military electronic equipment. It is well-known that aging is a major factor in frequency instability for several reasons. However, aging data of the crystal oscillator is usually not provided to the user. Moreover, in a battlefield environment a frequency reference for correcting the frequency of an oscillator may not be available due to communications security and jamming. Since aging is a major factor in frequency instability, and the measurement of aging is often a time-consuming and cumbersome process, devices, methods and articles of manufacture for both estimating past crystal oscillator aging and predicting future aging could be extremely valuable references for choosing high performance crystal oscillators.

One prior art estimation technique is to predict aging by using a linear aging model, but such linear aging estimation models are generally inaccurate and are not useful for long-term estimations.

Another prior art estimation technique uses the Kalman filter. The Kalman filter estimator has been used for linear aging estimation and prediction and has been improved by introducing a non-linear frequency model in which a logarithmic function is used to estimate and predict the frequency. While the improved Kalman filter estimator reduces prediction error, it suffers from several limitations, including that this technique requires knowing process noise covariance and measurement error covariance values that usually are not available in practice. Therefore, the shortcomings, inaccuracies and limitations of prior art techniques have created a long-felt need for crystal oscillator devices, methods and articles of manufacture able to estimate both an oscillator's past frequency aging and predict its frequency aging in order to correct an oscillator's frequency. This long-felt need is particularly acute in battlefield or tactical environments.

SUMMARY OF THE INVENTION

Accordingly, it is an object of the present invention to provide a simple and effective crystal oscillator frequency aging estimation and prediction device.

It is an another object of the present invention to provide a simple and effective method to both estimate and predict the frequency aging of crystal oscillators.

It is still a further object of the present invention to provide a simple and effective aging estimation and frequency aging prediction computer program for crystal oscillators as an article of manufacture.

To attain these and other objects and advantages of the present invention and to solve the long-standing problems, shortcomings and limitations of prior art techniques, the oscillator estimating and predicting device of the present invention can be utilized not only as a temporary frequency reference to correct frequency error based on statistical estimation, but can also provide a good prediction of aging data for crystal oscillator users. The oscillator estimation and predicting frequency device of the present invention comprises a crystal oscillator connected to a calculating means that uses an oscillator model with a plurality of logarithmic functions describing effects of a frequency output of the crystal oscillator, a means to recursively estimate parameters of the logarithmic functions to match the aging change of said crystal oscillator, a means to detect a plurality of outlier points in frequency measurements of said crystal oscillator, means to filter the plurality of outlier points using an estimation computation, means to predict the frequency of said crystal oscillator based on a plurality of best estimated parameters of said logarithmic function so that said frequency correction circuitry uses the output of said calculating means to correct the frequency of said crystal oscillator due to aging. Said calculating means utilizes a new mathematical model that optimally estimates the frequency aging of the crystal oscillator. The devices of the present invention also predict the frequency aging of a crystal oscillator.

The estimating and predicting method of the present invention utilizes a new mathematical model that optimally estimates and predicts the frequency of the oscillator, so that the oscillator's frequency can be corrected by using the predicted frequency without resorting to a frequency reference. When a frequency reference is not available, the estimating and predicting methods of the present invention operate based upon the oscillator's past behavior and use it to predict the frequency error produced by the frequency aging effect. At the same time, the oscillator will be calibrated by the frequency prediction to correct the frequency error. When a frequency reference is available, the methods of the present invention can update the crystal oscillator's parameters based on the frequency reference. The oscillator aging estimation devices and methods of the present invention can provide a simple and effective aging estimator which matches aging curves extremely well, without suffering from any of the disadvantages and shortcomings of prior art aging estimating techniques. The present invention also includes the additional advantage over Kalman filter aging estimating techniques by not requiring knowledge of process noise covariance and measurement error covariance.

The present invention also encompasses a computer program capable of simply and effectively estimating and predicting aging of a crystal oscillator, as an article of manufacture.

The term or expression "y(k)" k=1,2, . . . , n as used throughout this specification should be considered to refer to frequency estimation. The term or expression "y(n+l)" l=1, 2, . . . , as used throughout this specification should be considered to refer to frequency prediction. The term or expression "z(k)" as used throughout this specification should be considered to refer to frequency measurement. These definitions should apply in conjunction with any other commonly accepted definitions of those terms.

The exact nature of this invention as well as other objects and advantages thereof will be readily apparent from consideration of the following specification relating to the annexed drawings.

BRIEF DESCRIPTION OF THE DRAWINGS

FIG. 4 is a diagram illustrating the primary differences between the estimation and prediction functions of the present invention, with FIG. 4A illustrating frequency estimation and FIG. 4B illustrating frequency prediction.

DETAILED DESCRIPTION OF THE INVENTION

Those concerned with quartz crystal oscillators aging estimating and predicting have long recognized the need for more precise and effective devices and methods to both better estimate past aging of quartz crystal oscillators and to better predict their future aging, as a much-needed and valuable reference for choosing high performance crystal oscillators, without suffering from any of the shortcomings, drawbacks, disadvantages and limitations of prior art techniques.

Figure 1:
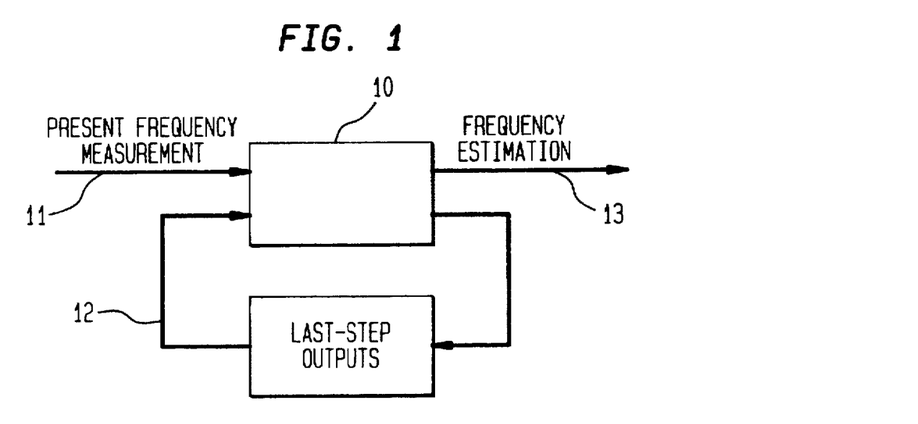
FIG. 1 is a conceptual block diagram depicting recursive frequency aging estimation.

Referring now to the drawings, FIG. 1 is a simplified, conceptual block diagram depicting recursive frequency aging estimation. As shown in FIG. 1, an aging estimator means 10 simultaneously receives a present frequency measurement 11 from the subject quartz crystal oscillator and a last-step output 12 stored in said aging estimator means 10. Said last-step output 12 are calculation results obtained one step prior to determining the present frequency calculation. Said aging estimator means 10, which can be a means for calculating or a means for computing, having received those inputs 11 and 12, respectively, and processing either an aging estimation or predicting calculation, as the case may be, provides a frequency estimation output 13 back to said subject quartz crystal oscillator. The main advantage of utilizing only said plurality of last-step outputs 12 along with the present frequency measurements is that massive data storage is not required.

Figure 2:
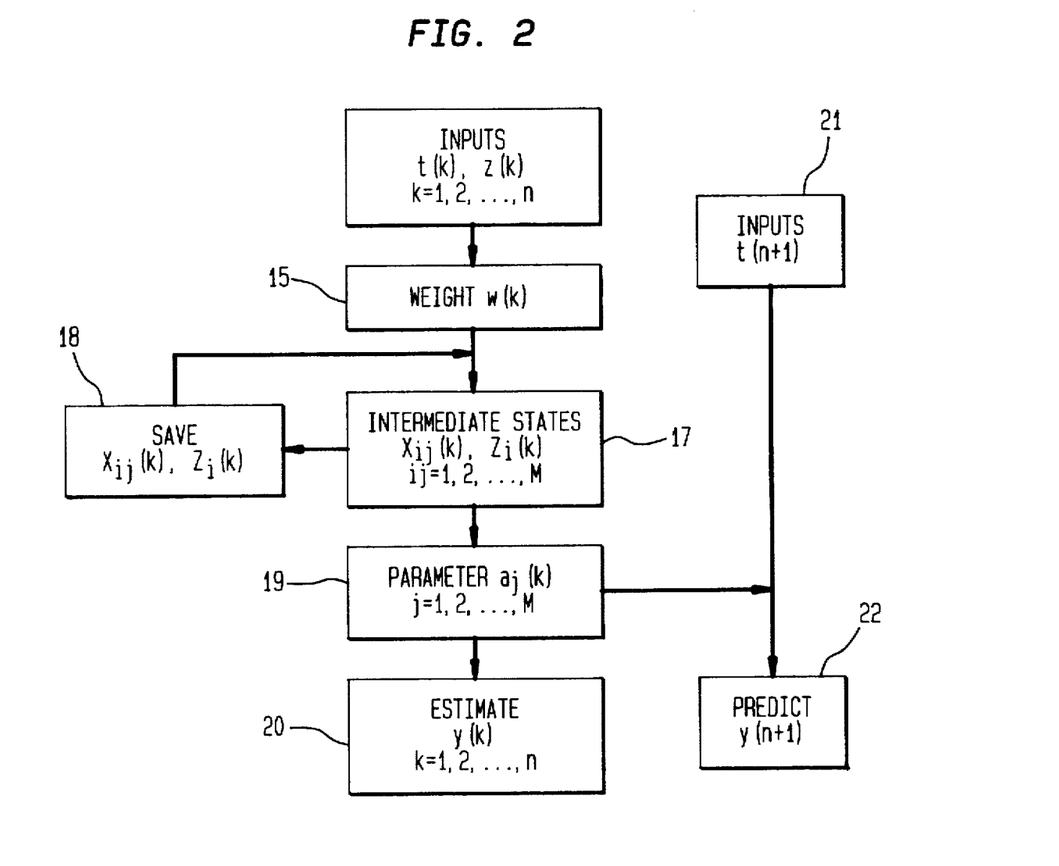
FIG. 2 is an estimation and prediction data flow diagram with a number of key mathematical symbols used in the present invention.

FIG. 2 depicts the flow of data during both the estimation and prediction cycles of the devices, methods and articles of manufacture of the present invention. In terms of data flow, aging estimation begins by taking a measurement z(k) at instant t(k), where k=1, 2, . . . , is the computation step, computing an adaptive weight w(k) 15, calculating intermediate states $X_{ij}(k)$ and $Z_i(k)$ 17 and saving them for the next calculation, calculating parameter $a_j(k)$ and j=1, 2, . . . , M 19 based on intermediate state $X_{ij}(k)$ and $Z_i(k)$ and finally calculating a frequency aging estimate y(k) 20 using parameter $a_j(k)$ 19. Similarly, for making a frequency aging prediction, once the parameter $a_j(k)$ 19 is established, the frequency prediction can be calculated based on the input t(n+l)21.

Crystal oscillator aging estimation in accordance with the present invention is based on a number of mathematical calculations. Since these expressions are useful for understanding how the devices, methods and articles of manufacture of the present invention operate, a series of these equations are disclosed in this specification. Based upon the shortcomings and disadvantages of the prior art aging estimating techniques, it has been long-recognized that a new mathematical model is needed. If the frequency f(k) measured at the instant of time t(k), where k=0, 1, . . . we define:

$$z(k) = \frac{f(k) - f(1)}{f(1)}$$

as frequency measurement the new mathematical aging estimation model is:

$$y(k) = a_o(n) + \sum_{j=1}^{M} a_j(n)\log(t(k) + d_o + d \cdot (j-1)) \qquad \text{(EQ 1)}$$
$$1 \leq k \leq n$$

The advantages of this equation over prior art techniques are that it not only accounts for the non-linear aspect of frequency aging but also introduces more freedom in choosing the parameters $a_1, a_2 \ldots a_j$ thus providing more accurate estimation and prediction. In Equation 1, where y(k) is a frequency estimated at instant t(k), d is a real number chosen between 0.1 and 1.0, M is an integer chosen between 5 to 10, and $d_o \approx 1-0.5 \cdot d \cdot (M-1)$. Experiments show that frequency estimation y(k) is not very sensitive to parameters d, $d_o$ and m. Parameters $a_j(n)$, j=0, 1 . . . , M, are estimated recursively as shown in FIGS. 1 and 2 with last-step data outputs and present data inputs. This model consists of a basic function log (t+$d_o$) with its x-dimensional shifts of d, 2d, . . . , (M–1)d and a y-dimensional shift of $a_o$. In this mathematical model, each logarithmic term has a unique zero-crossing point on the x-coordinate, making these terms candidates for fitting data z(1), z(2), . . . , z(k), by minimizing the merit function, as follows:

$$J = \sum_{k=1}^{n} e^{-(k(k)-\alpha(k-1))}[z(k) - y(k)]^2 \qquad \text{(EQ 2)}$$
$$z(0) = z(1)$$

with best-fit parameters $a_j$, j=0, 1 . . . , M. After estimating parameters $a_o, a_1, \ldots, a_M$ at instant of time t(n), the crystal oscillator's frequency at instant of time t(n+l), can be predicted according to the following frequency prediction mathematical model:

$$y(n+l) = a_o(n) + \sum_{j=1}^{M} a_j(n)\log(t(n+l) + d_o + d \cdot (j-1)) \qquad \text{(EQ 8)}$$
$$l = 1, 2, \ldots$$

This prediction mathematical model consists of the basic function log(t+$d_0$) with its x-dimensional shifts of d, 2d, . . . , (M–1)d and a y-dimensional shift of $a_0$.

The aging A(t) of a crystal oscillator can be described by frequency function y(t). Mathematically the derivative equation is:

$$A(t) = \frac{d}{dt} y(t)$$

Therefore, these equations demonstrate that aging estimation and prediction is based on the frequency estimation and prediction, y(k) and y(n+l), respectively, and that frequency estimation and prediction depends on the estimation of parameters $a_j$, j=0, 1 . . . , M, from Equation 1. Given a frequency measurement z(k), k=1, 2, . . . , parameter $a_j$ is estimated in the manner depicted in FIG. 2 by defining:

$$x_j(k) = \begin{pmatrix} \log(t(k) + d_o \cdot (j-1)) & 1 < j < M \\ 1 & j = 0 \end{pmatrix} \qquad \text{(EQ 3)}$$

computing the adaptive weight which has an inverse relationship to the difference between z(k) and z(k–1)

$$w(k) = e^{-|z(k)-z(k-1)|} \quad \text{(EQ 4)}$$
$$z(0) = z(1)$$

It should be noted that w(k) is a high pass filter, which eliminates the aging noise and frequency outliers, however, alternative w(k) values may be used, such as:

$$w(k) = e^{-(z(k)-z(k-1))^2}$$
$$z(0) = z(1)$$

or $$w(k) = e^{-(z(k)-2z(k-1)+z(k-2))^2}$$
$$k = 3,4,\ldots$$

then calculating the matrix:

$$X_{ij}(k) = X_{ij}(k-1) + w(k) \cdot x_i(k) \cdot x_j(k) \quad \text{(EQ 5)}$$
$$X_{ij}(0) = 0$$
$$i,j = 1,2,\ldots,M$$

$$Z_i(k) = Z_i(k-1) + w^2(k) \cdot z(k) \cdot x_i(k) \quad \text{(EQ 6)}$$
$$Z_i(0) = 0$$
$$i = 1,2,\ldots,M$$

and saving $X_{ij}(k)$ and $Z_i(k)$ as the last-step outputs and then calculate:

$$a_j(k) = \sum_{i=0}^{M} [X(k)]_{ij}^{-1} \cdot Z_i(k) \quad \text{(EQ 7)}$$
$$j = 0,1,2,\ldots,M$$

where, $[X(k)]^{-1}$ is the inverse matrix of $X(k)$, and $[X(k)]_{ij}^{-1}$ is the ij-th entry of matrix $[X(k)]^{-1}$.

By inserting Equation 7 into Equation 1, one can estimate aging by estimating frequency y(k). It should be noted that the computation of $a_j(k)$ requires only an M by M matrix X(k), an M-dimensional vector Z(k) and scalars z(k) and t(k).

Figure 3:
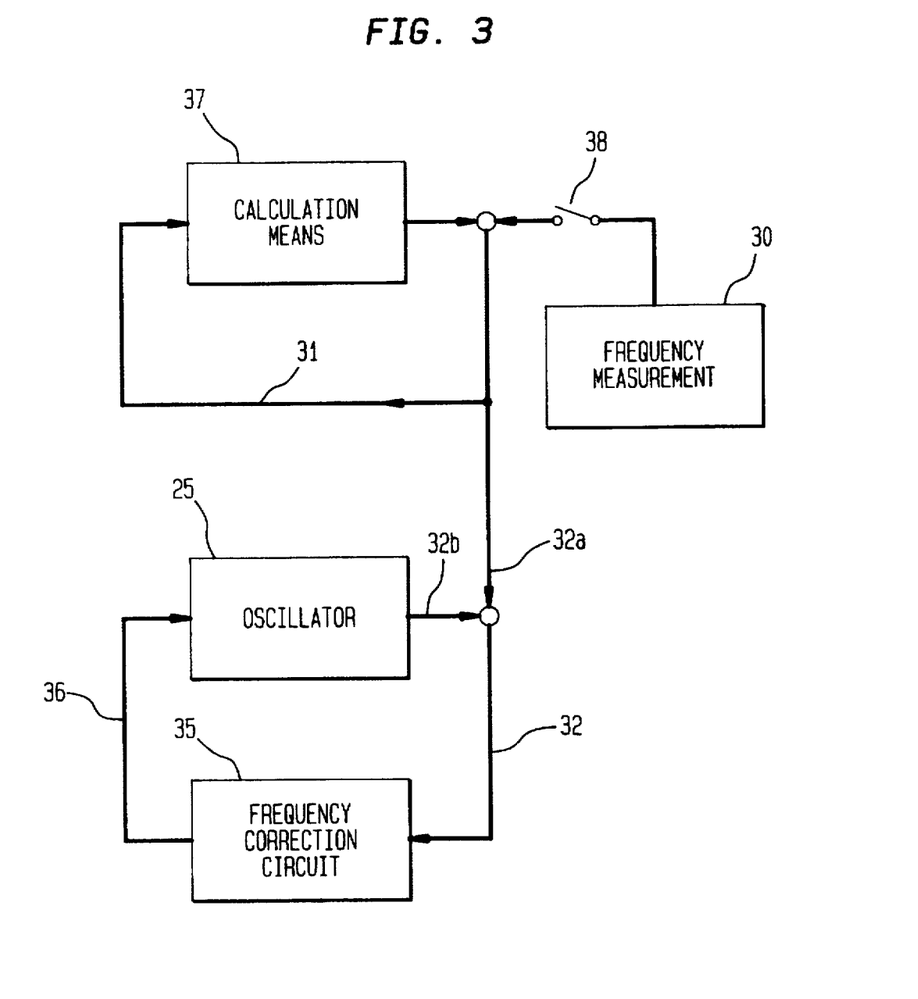
FIG. 3 is a block diagram depicting frequency correction in accordance with the present invention.

Having described the mathematical relationships found in the aging estimation of the quartz crystal oscillator, the present invention discloses and claims aging estimation and prediction devices which satisfies the long-recognized need for more precise and effective devices to make smart quartz crystal oscillators as a much-needed and valuable aging prediction tool to aid in choosing high performance crystal oscillators, without suffering from any of the shortcomings, drawbacks, disadvantages and limitations of prior art techniques. Referring now to FIG. 3, there is depicted a block diagram of the frequency estimating and prediction device of the present invention, comprising a crystal oscillator 25 connected to a calculation means 37, said calculation means 37, being an oscillator model, having a plurality of software programs, including an aging estimation calculation algorithm and an aging prediction calculation algorithm based on the new mathematical models for estimating and predicting frequency aging, respectively, in accordance with Equations 1 and 8. Said calculation means 37, being an oscillator model, having a means to store intermediate data and results data uses a plurality of shifted logarithmic functions which describe the effects of a given frequency output of said crystal oscillator 25. Said plurality of shifted logarithmic functions can be seen in Equation 8. When a frequency measurement 30 is available, with a switch 38 closed, said calculation means 37 performs a plurality of parameter calibrations 31, following the calculations depicted in the FIG. 2 data flow. When said frequency measurement 30 is not available, with said switch 38 open, an output of oscillator 32 (b) is compared to an output of said oscillator model of the calculation means 37 resulting in a frequency error 32, which is then fed to said crystal oscillator 25 to correct the frequency. A frequency correction circuit 35 being connected in a feedback loop to said crystal oscillator 25, said frequency correction circuit 35 utilizing a frequency error between a predicted frequency output and an oscillator frequency output to correct the frequency of said crystal oscillator 25 due to aging.

Figure 4A:
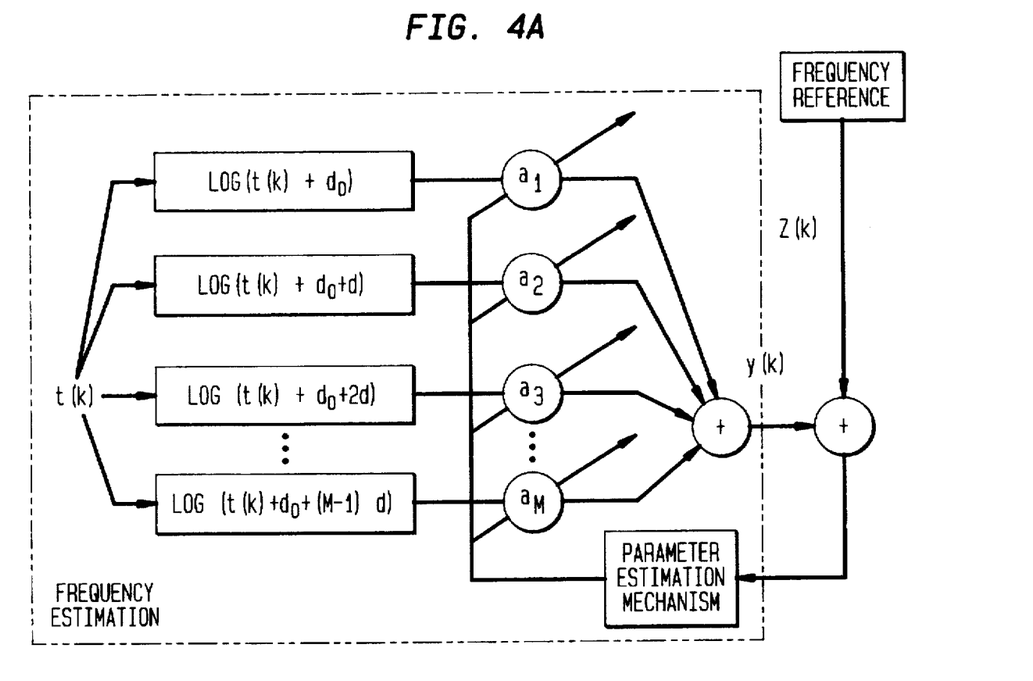
Figure 4B:
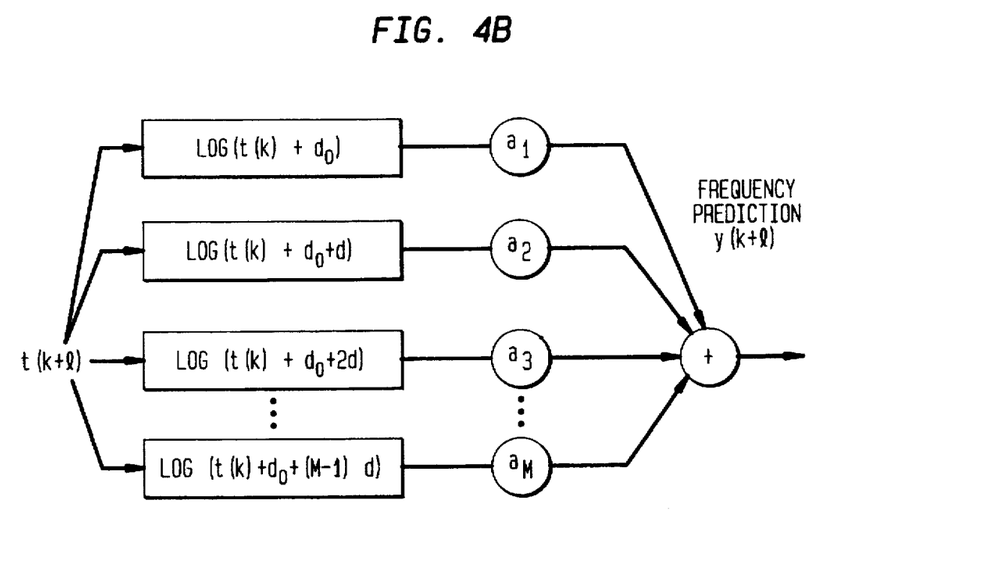

Said calculation algorithm included within the oscillator model of said calculation means 37 is based on the Equation 1 new mathematical model described above, and said calculation means 37 acts as a temporary frequency reference to correct the frequency error within said frequency output 32(b). Said calculation means 37 can be a data processor, a computer, firmware or an integrated circuit having the necessary architecture. Said crystal oscillator 25 can be any type of quartz crystal oscillator. The primary differences between the estimation and prediction functions are illustrated in FIG. 4. Referring now to FIG. 4, FIG. 4A illustrates the FIG. 3 architecture involved in frequency estimation, and for comparison purposes, FIG. 4B illustrates the FIG. 3 architecture involved in frequency prediction.

Figure 5:
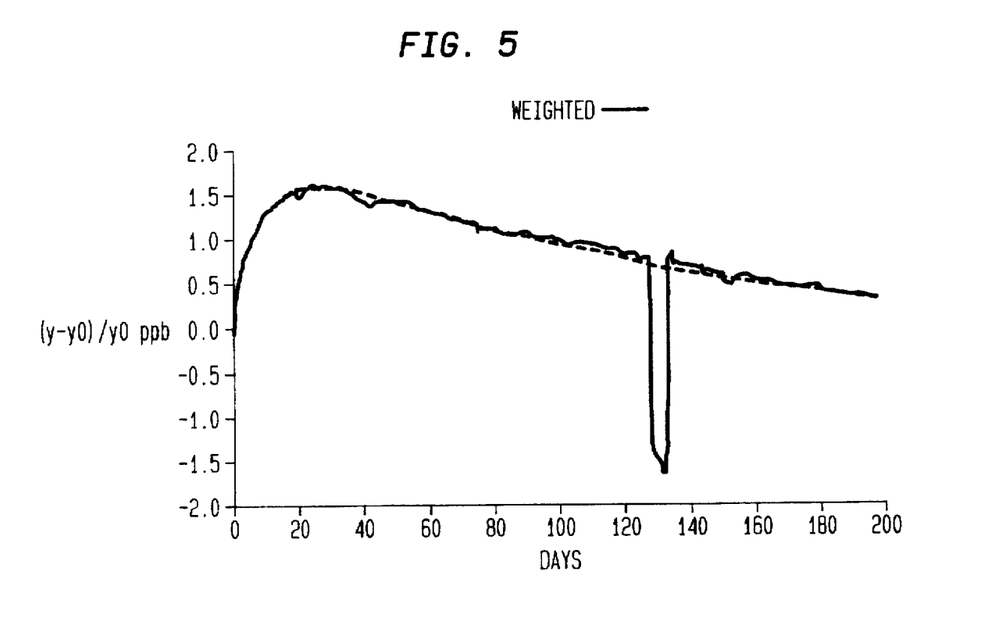
FIG. 5 is a chart depicting aging estimation test results.

In operation, the FIG. 3 aging estimation device of the present invention has been successfully tested in an experimental laboratory environment. FIG. 5 is a chart depicting aging estimation test results of the devices of the present invention in one experiment. Referring now to FIG. 5, the frequency of an oscillator was estimated using the new mathematical model described in Equation 1, $d_o$ was chosen as a real number between 0.1 and 1.0, M is an integer chosen between 5 to 10 for Equations 1 and 8 and plot y(k) where the solid line represents frequency frequency measurement z(k) and the dashed line represents y(k).

Figure 6:
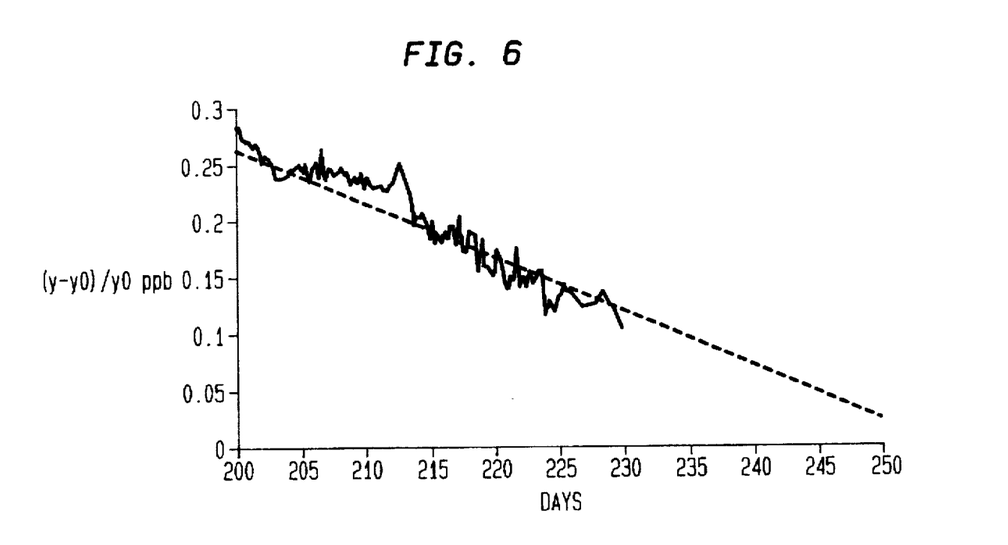
FIG. 6 is a chart depicting aging prediction test results.

FIG. 6 is a chart depicting aging prediction test using the devices of the present invention, where the solid line represents actual frequency measurement and the dashed line represents a one-step frequency prediction computed in accordance with the Equation 8.

Both FIGS. 5 and 6 demonstrate that the estimating and predicting results, respectively, were satisfactory because of the freedom to choose $a_1$, and $_2,\ldots,a_M$ and nonlinear functions and more freedom in choosing parameters utilized in accordance with the present invention. It is also significant to note that although the FIG. 5 frequency aging results were close to a logarithmic function, the short-term frequencies illustrated in the solid line between days 1 and 40, respectively, are non-logarithmic. However, the aging model matches this frequency data very well because more than one logarithmic function is used with the new aging model of Equation 1. Furthermore, outlier data indicated by the solid line along day 130 does not notably effect the estimation and prediction results due to the adaptive weight used in the merit function as described above.

The recursive crystal oscillator aging estimation and prediction device used in the FIGS. 5 and 6 experiments was implemented by using frequency measurement data obtained from commercially available quartz crystal oscillators. These frequency measurement data were in a digital format saved in a computer database, along with a standard, commercially-available personal computer utilizing the Matlab programming language, however, no limitations on the scope of the appended claims of this invention should be inferred from using that arrangement, as those skilled in the oscillator arts will readily recognize that numerous other types of computers, data processors and other similar computing means, along with a variety of programming languages, programs and software can be efficiently utilized in accordance with this invention. Similarly, those skilled in the oscillator arts will also readily recognize that numerous other sizes, shapes, elements and configurations of this device are possible, all of which considered to be within the contemplation of the present invention. Additionally, while the aging estimator and predictor have been combined in the present invention because it would generally be more useful to have both capabilities, it is also within the contemplation of the present invention to have separate stand-alone devices that each perform those functions. The estimation and prediction devices of the present invention need not be limited solely to quartz crystal aging, and can be used for any data that can be matched by any combinations of logarithmic functions.

Referring once again to the FIG. 2 data flow diagram, the present invention also discloses and claims recursive crystal oscillator aging estimation and prediction methods. Aging estimation begins by inputting the frequency measurement $z(k)$ taken at instant $t(k)$, computing an adaptive weight $w(k)$ 15, calculating intermediate states $X_{ij}(k)$ and $Z_i(k)$ 17, saving those intermediate states as the last-step outputs 18 for the next calculation, calculating parameter $a_j(k)$ and $j=1, 2, \ldots, M$ 19 with the intermediate states $X_{ij}(k)$ and $Z_i(k)$ 17 and finally calculating a frequency aging estimate $y(k)$ 20. Similarly, for making a frequency aging prediction, once the parameter $a_j(k)$ 19 is established, the frequency prediction can be calculated based on the input $t(n+l)$ 21.

Referring once again to FIG. 3, the present invention provides for recursive methods for estimating and predicting crystal oscillator frequency, comprising the steps of connecting a crystal oscillator 25 to a calculation means 37 having a plurality of software programs including aging estimation and prediction calculation algorithms based on the new mathematical models for estimating and predicting frequency, describing the effects of a given frequency output of said crystal oscillator 25 due to the aging of said crystal oscillator 25, said calculation means 37 being an oscillator model, having a means to use a plurality of shifted logarithmic functions which describe those frequency effects. In a filtering step, said calculation means 37, using an adaptive computation, filters a plurality of outlier frequency data with a plurality of adaptive computations, such as those described in Equations 2 and 4. In an establishment step, a set of logarithmic functions are established by said calculation means 37 to estimate the aging characteristics of various crystal oscillators, estimating unknown parameters and saving them as last-step outputs for upcoming calculations. In a matching step, frequency estimation outputs from the new mathematical model are matched with a plurality of predetermined frequency measurement curves, and using a best-fit method, said calculation means 37 determines the parameters of the crystal oscillator model of said calculation means 37. The method of the present invention also entails calculating a plurality of best estimated parameters of said logarithmic function and adaptive weights of said outlier points by said calculation means, estimating said frequency of the crystal oscillator in a means for estimating said frequency of the crystal oscillator based on said calculation means calculating said plurality of best estimated parameters of said logarithmic function using said plurality of best estimated parameters of said logarithmic function in said calculation means 37 to obtain a predicted frequency output and providing said predicted frequency output to a frequency correction circuit 35 which is connected in a feedback loop to said crystal oscillator 25, said frequency correction circuit 35 utilizing a frequency error between a predicted frequency output and an oscillator frequency output to correct the frequency of said crystal oscillator 25 due to aging.

When a frequency measurement 30 is available, during a receiving step, said calculation means 37 performs a plurality of parameter calibrations 31, following the calculations depicted in the FIG. 2 data flow. When said frequency measurement 30 is not available, during a comparison step, an output of oscillator 32($b$) is compared to an output of said oscillator model of the calculation means 37 resulting in a frequency error 32, which during a correction step is then fed to said crystal oscillator 25 to correct the frequency. Said calculation algorithm included within the oscillator model of said calculation means 37 is based on the previously described Equation 1 new mathematical model, and said calculation means 37 acts as a temporary frequency reference to correct the frequency error within said frequency output 32($b$). Following a data storage step and a calculation step the method of the present invention is completed.

In performing the steps of the recursive methods for determining crystal oscillator frequency, said calculation means 37 can be a data processor, a computer, a firmware means or an integrated circuit having the necessary architecture. Said crystal oscillator 25 can be any type of quartz crystal oscillator. The primary differences between the estimation and prediction functions are illustrated in FIG. 4. Referring now to FIG. 4, FIG. 4A illustrates the FIG. 3 block diagram's architecture for frequency estimation, and for comparison purposes, FIG. 4B illustrates the FIG. 3 block diagram's architecture for frequency prediction. The recursive crystal oscillator aging estimating and prediction methods disclosed herein were implemented by using a commercially available personal computer along with the commercially-available Matlab programming software, however, no limitations on the scope of the appended claims of this invention should be inferred from using that equipment in the steps of this method, as those skilled in the oscillator arts will readily recognize that numerous other types of computers, data processors and other similar computing means, along with a variety of programming languages, programs and software can be efficiently utilized in accordance with the methods of this invention. The estimation and prediction methods of the present invention need not be limited solely to quartz crystal aging, and can be used for any data that can be matched by any combinations of logarithmic functions.

The present invention also encompasses a computer-readable medium, such as a computer program, capable of simply and effectively estimating and predicting frequency aging of a crystal oscillator, as an article of manufacture to automatically performs the necessary measurements and calculations and operates in essentially the manner as disclosed for the devices and methods of the present invention in accordance with FIGS. 2 and 3. Referring once again to FIG. 3, the present invention provides a computer-readable medium whose contents cause a computer system 37 to recursively estimate and predict the aging of a crystal oscillator 25, said computer system having an aging calculation algorithm, a means for storing intermediate result data and input data using a set of shifted logarithmic functions describing a plurality frequency output of effects caused by a plurality of aging characteristics of said crystal oscillator 25, means for recursively estimating a plurality of weights from a plurality of logarithmic functions based on a plurality of present data inputs from said crystal oscillator 25 and an aging prediction calculation algorithm. Said computer system 37 being an oscillator model, is connected to said crystal oscillator and performs the steps of receiving a plurality of parameter calibrations 31 from said crystal oscillator 25, said crystal oscillator 25 having a given frequency range, a frequency output, a plurality of aging characteristics and a plurality of present data inputs, measuring a plurality of frequency measurements 30 from said given frequency range of said crystal oscillator 25, said plurality of frequency measurements 30 including a plurality of outlier points detected in a means for detecting a plurality of outlier points, filtering said plurality of outlier points using an adaptive computation in a means for filtering said plurality of outlier points, calculating a plurality of best estimated parameters weights of said logarithmic function and said outlier points and estimating said frequency of the crystal oscillator 25 in a means for estimating said frequency of the crystal oscillator 25 based on said calculation step, combining said plurality of best estimated parameters of said logarithmic function and said outlier points with said plurality of adaptive weights into a predicted frequency output, providing said predicted frequency output to a frequency correction circuit 35 connected in a feedback loop with said crystal oscillator 25, said frequency correction circuit 35 utilizing a frequency error between a predicted frequency output and an oscillator frequency output, storing said plurality of present data inputs and correcting the frequency of said crystal oscillator 25 due to aging.

The variations and refinements disclosed above in connection with the devices and methods of the present invention concerning different types of computer systems, different types of crystal oscillators and different types of frequency references apply equally to the computer-readable medium capable of simply and effectively estimating and predicting aging of a crystal oscillator, as an article of manufacture, to automatically perform the necessary measurements and calculations, disclosed herein and claimed in the appended claims. Similarly, while the present invention were implemented by using a commercially available Sun computer workstation and certain programming software, no limitations on the scope of the appended claims of this invention should be inferred from using that equipment in connection with this article of manufacture, as those skilled in the -oscillator arts will readily recognize that numerous other types of computers, data processors and other similar computing means, along with a variety of programming languages, programs and software can be efficiently utilized in accordance with the methods of this invention. The computer-readable medium capable of simply and effectively estimating and predicting aging of a crystal oscillator of the present invention need not be limited solely to quartz crystal aging, and can be used for any data that can be matched by any combinations of logarithmic functions.

What I claim is:

1. A recursive crystal oscillator aging estimation and prediction device, comprising:
   a crystal oscillator having a given frequency range, an oscillator frequency output, a plurality of aging characteristics and a plurality of present frequency measurements;
   a means for calculating connected to said crystal oscillator, said calculating means having an aging estimation calculation algorithm, a means for storing a plurality of intermediate result data and input data using a set of shifted logarithmic functions describing a plurality frequency output of effects caused by a plurality of aging characteristics, a means for recursively estimating a plurality of parameters from a plurality of logarithmic functions based on a plurality of present data inputs from said crystal oscillator and an aging prediction calculation algorithm;
   said calculating means being an oscillator model, provides a plurality of parameter calibrations;
   a means for detecting a plurality of outlier points in a plurality of frequency measurements of said crystal oscillator;
   a means for filtering said plurality of outlier points using an adaptive estimation computation;
   a means for estimating said frequency of said crystal oscillator based on said calculating means calculating a plurality of best estimated parameters of said logarithmic function;
   said calculating means utilizing said plurality of best estimated parameters of said logarithmic function to obtain a predicted frequency output provided to a frequency correction circuit;
   a data storage means; and
   said frequency correction circuit being connected in a feedback loop to said crystal oscillator, said frequency correction circuit utilizing a frequency error between said predicted frequency output and said oscillator frequency output to correct the frequency of said crystal oscillator due to aging.

2. The recursive crystal oscillator aging estimation and prediction device, as recited in claim 1, further comprising a parameter update means connected to said calculation means to provide a plurality of updated parameters for said logarithmic functions when a current frequency measurement is available.

3. The recursive crystal oscillator aging estimation and prediction device, as recited in claim 2, wherein said aging estimation calculation algorithm utilizes the following mathematical aging model:

$$y(k) = a_o(n) + \sum_{j=1}^{M} a_j(n)\log(t(k) + d_o + d \cdot (j-1))$$
$$1 \leq k \leq n$$

and where said y(k) is frequency estimation.

4. The recursive crystal oscillator aging estimation and prediction device, as recited in claim 3, wherein said aging prediction calculation algorithm utilizes the following mathematical aging model:

$$y(n+l) = a_o(n) + \sum_{j=1}^{M} a_j(n)\log(t(n+l) + d_o + d \cdot (j-1))$$
$$l = 1,2,\ldots$$

and where said y(n+l) is frequency prediction.

5. The recursive crystal oscillator aging estimation and prediction device, as recited in claim 4, further comprising a means for predicting the frequency of said crystal oscillator based on a plurality of best estimated weights of said logarithmic function and said outlier points.

6. The recursive crystal oscillator aging estimation and prediction device, as recited in claim 5, further comprising said calculation means acting as a temporary frequency reference to correct said frequency error.

7. The recursive crystal oscillator aging estimation and prediction device, as recited in claim 6, further comprising encoding said aging estimation calculation algorithm and said aging prediction calculation algorithm onto a computer-readable medium.

8. The recursive crystal oscillator aging estimation and prediction device, as recited in claim 7, wherein said calculation means is a computer means having said plurality of software programs.

9. The recursive crystal oscillator aging estimation and prediction device, as recited in claim 7, wherein said calculation means is a firmware means.

10. A recursive crystal oscillator aging estimation and prediction method, comprising the steps of:
   connecting a crystal oscillator to a means for calculating, said crystal oscillator having a given frequency range, an oscillator frequency output, a plurality of aging characteristics and a plurality of present data inputs, said calculating means having an aging calculation algorithm, a means for storing a plurality of intermediate result data and input data using a set of shifted logarithmic functions describing a plurality frequency output of effects caused by a plurality of aging characteristics, a means for recursively estimating a plurality of parameters from a plurality of logarithmic functions based on a plurality of present data inputs from said crystal oscillator and an aging prediction calculation algorithm;

said calculating means, being an oscillator model, provides a plurality of parameter calibrations;

measuring a plurality of frequency measurements from said given frequency range of the crystal oscillator, said plurality of frequency measurements including a plurality of outlier points;

detecting said plurality of outlier points in means for detecting a plurality of outlier points;

filtering said plurality of outlier points using an adaptive computation in a means for filtering said plurality of outlier points;

calculating a plurality of best estimated parameters of said logarithmic function and a plurality of adaptive weights from said plurality of outlier points by said calculation means;

estimating said frequency of the crystal oscillator in a means for estimating said frequency of the crystal oscillator based on said calculation means calculating said plurality of best estimated parameters of said logarithmic function;

utilizing said plurality of best estimated parameters of the logarithmic function in said calculation means to obtain a predicted frequency output;

providing said predicted frequency output to a frequency correction circuit;

connecting said frequency correction circuitry in a feedback loop with said crystal oscillator, said frequency correction circuit utilizing a frequency error between said predicted frequency output and said oscillator frequency output;

storing said plurality of present data inputs; and correcting the frequency of said crystal oscillator due to aging.

11. The recursive crystal oscillator aging estimation and prediction method, as recited in claim 10, further comprising the step of connecting a parameter update means to said calculation means to provide a plurality of updated parameters for said logarithmic functions when a current frequency measurement is available.

12. The recursive crystal oscillator aging estimation and prediction method, as recited in claim 11, further comprising said aging estimation calculation algorithm utilizing the following mathematical aging model:

$$y(k) = a_o(n) + \sum_{j=1}^{M} a_j(n)\log(t(k) + d_o + d \cdot (j-1))$$
$$1 \leq k \leq n$$

and where said y(k) is frequency estimation.

13. The recursive crystal oscillator aging estimation and prediction method, as recited in claim 12, further comprising said aging prediction calculation algorithm utilizing the following mathematical aging model:

$$y(n+l) = a_o(n) + \sum_{j=1}^{M} a_j(n)\log(t(n+l) + d_o + d \cdot (j-1))$$
$$l = 1, 2, \ldots$$

and where said y(n+l) is frequency prediction.

14. The recursive crystal oscillator aging estimation and prediction method, as recited in claim 13, further comprising the step of providing a means for predicting the frequency of said crystal oscillator based on a plurality of best estimated weights of said logarithmic function and said outlier points.

15. The recursive crystal oscillator aging estimation and prediction method, as recited in claim 14, further comprising the step of said calculation means acting as a temporary frequency reference oscillator to correct said frequency error.

16. The recursive crystal oscillator aging estimation and prediction method, as recited in claim 15, further comprising the step of encoding said aging estimation calculation algorithm and said aging prediction calculation algorithm onto a computer-readable medium.

17. The recursive crystal oscillator aging estimation and prediction method, as recited in claim 16, wherein said calculation means is a computer means having said plurality of software programs.

18. The recursive crystal oscillator aging estimation and prediction method, as recited in claim 16, wherein said calculation means is a firmware means.

19. A computer-readable medium whose contents cause a computer system to recursively estimate and predict the aging of a crystal oscillator, said computer system having an aging calculation algorithm, a means for storing a plurality of intermediate result data and input data using a set of shifted logarithmic functions describing a plurality frequency output of effects caused by a plurality of aging characteristics of said crystal oscillator, means for recursively estimating a plurality of weights from a plurality of logarithmic functions based on a plurality of present data inputs from said crystal oscillator and an aging prediction calculation algorithm, said computer system being an oscillator model, comprising:

performing a plurality of parameter calibrations from said crystal oscillator when a frequency measurement is available, said crystal oscillator having a given frequency range, an oscillator frequency output, a plurality of aging characteristics and a plurality of present data inputs;

measuring a plurality of frequency measurements from said given frequency range of said crystal oscillator, said plurality of frequency measurements including a plurality of outlier points detected in a means for detecting a plurality of outlier points;

detecting said plurality of outlier points and filtering said plurality of outlier points using an adaptive computation in a means for filtering said plurality of outlier points;

calculating a plurality of best estimated parameters of said logarithmic function and a plurality of adaptive weights of said plurality of outlier points and estimating said frequency of the crystal oscillator in a means for estimating said frequency of the crystal oscillator based on said calculation step;

utilizing said plurality of best estimated parameters of said logarithmic function to obtain a predicted frequency output;

providing said predicted frequency output to a frequency correction circuit connected in a feedback loop with said crystal oscillator, said frequency correction circuitry utilizing a frequency error between said predicted frequency output and said oscillator frequency output;

storing said plurality of present data inputs; and correcting the frequency of said crystal oscillator due to aging.

20. The computer-readable medium, as recited in claim 19, further comprising the step of connecting a parameter update means to said computer system to provide a plurality of updated parameters for said logarithmic functions when a current frequency measurement is available.

21. The computer-readable medium, as recited in claim 20, further comprising said aging estimation calculation algorithm utilizing the following mathematical aging model:

$$y(k) = a_o(n) + \sum_{j=1}^{M} a_j(n)\log(t(k) + d_o + d \cdot (j-1))$$
$$1 \leq k \leq n$$

and where y(k) is frequency estimation.

22. The computer-readable medium, as recited in claim 21, further comprising said aging prediction calculation algorithm utilizing the following mathematical aging model:

$$y(n+l) = a_o(n) + \sum_{j=1}^{M} a_j(n)\log(t(n+l) + d_o + d \cdot (j-1))$$
$$l = 1,2, \ldots$$

and where said y(n+l) is frequency prediction.

23. The computer-readable medium, as recited in claim 22, further comprising the step of said computer system providing a means for predicting the frequency of said crystal oscillator based on a plurality of best estimated weights of said logarithmic function.

24. The computer-readable medium, as recited in claim 23, further comprising the step of said computer system acting as a temporary frequency reference oscillator to correct said frequency error.

25. The computer-readable medium, as recited in claim 24, further comprising the step of connecting a frequency measurement to said computer system.

26. The computer-readable medium, as recited in claim 25, further comprising the steps of encoding said contents of the computer-readable medium onto at least one computer disk.

27. The computer-readable medium as recited in claim 25, wherein said computer system is a firmware means.

* * * * *